United States Patent
Schmid et al.

(10) Patent No.: US 8,877,073 B2
(45) Date of Patent: Nov. 4, 2014

(54) IMPRINT LITHOGRAPHY TEMPLATE

(75) Inventors: Gerard M. Schmid, Austin, TX (US); Douglas J. Resnick, Leander, TX (US); Sidlgata V. Sreenivasan, Austin, TX (US); Frank Y. Xu, Round Rock, TX (US)

(73) Assignee: Canon Nanotechnologies, Inc., Austin, TX (US)

( * ) Notice: Subject to any disclaimer, the term of this patent is extended or adjusted under 35 U.S.C. 154(b) by 1113 days.

(21) Appl. No.: 12/604,866

(22) Filed: Oct. 23, 2009

(65) Prior Publication Data

US 2010/0102029 A1  Apr. 29, 2010

Related U.S. Application Data

(60) Provisional application No. 61/108,636, filed on Oct. 27, 2008.

(51) Int. Cl.
| | | |
|---|---|---|
| *C25F 3/00* | (2006.01) | |
| *B82Y 10/00* | (2011.01) | |
| *B82Y 40/00* | (2011.01) | |
| *G03F 7/00* | (2006.01) | |

(52) U.S. Cl.
CPC ............ *G03F 7/0002* (2013.01); *B82Y 10/00* (2013.01); *B82Y 40/00* (2013.01); *G03F 7/0017* (2013.01)
USPC .................. 216/11; 216/40; 427/256; 156/60

(58) Field of Classification Search
None
See application file for complete search history.

(56) References Cited

U.S. PATENT DOCUMENTS

| | | |
|---|---|---|
| 6,334,960 B1 | 1/2002 | Willson et al. |
| 6,696,220 B2 | 2/2004 | Bailey et al. |
| 6,900,881 B2 | 5/2005 | Sreenivasan et al. |
| 6,916,584 B2 | 7/2005 | Sreenivasan et al. |
| 6,919,152 B2 | 7/2005 | Sreenivasan et al. |
| 6,986,975 B2 | 1/2006 | Sreenivasan et al. |

(Continued)

FOREIGN PATENT DOCUMENTS

| | | |
|---|---|---|
| DE | 102007024653 | 12/2008 |
| JP | 2001189466 | 7/2001 |

(Continued)

OTHER PUBLICATIONS

Park et al., Block Copolymer Lithography: Periodic Arrays of ~10.11 Holes in 1 Square Centimeter, Science, American Association for the Advancement of Science, Washington D.C. (online; retrieved Jul. 14, 2008) http://www.sciencemag.org/cgi/content/ful/276/5317/1401 May 30, 1997.

(Continued)

*Primary Examiner* — Binh X Tran
*Assistant Examiner* — David Cathey, Jr.
(74) *Attorney, Agent, or Firm* — Cameron A. King

(57) ABSTRACT

Systems, methods, and processes for forming imprint lithography templates from a multi-layer substrate are described. The multi-layer substrate may include a block copolymer layer positioned on a substrate layer. The block copolymer layer may include two or more domains. At least one domain may have a different composition sensitivity than another domain such that the domains have different reactions to a specific process. Reaction of the domains to the specific process may provide a pattern in the block copolymer layer. The pattern may be transferred into the substrate layer to form the imprint lithography template.

19 Claims, 10 Drawing Sheets

(56) References Cited

U.S. PATENT DOCUMENTS

| | | | |
|---|---|---|---|
| 7,027,156 | B2 | 4/2006 | Watts et al. |
| 7,037,639 | B2 | 5/2006 | Voisin |
| 7,070,405 | B2 | 7/2006 | Sreenivasan et al. |
| 7,077,992 | B2 | 7/2006 | Sreenivasan et al. |
| 7,136,150 | B2 | 11/2006 | Sreenivasan et al. |
| 7,229,273 | B2 | 6/2007 | Bailey et al. |
| 7,281,921 | B2 | 10/2007 | Watts et al. |
| 7,309,225 | B2 | 12/2007 | McMackin et al. |
| 7,699,598 | B2 | 4/2010 | Sreenivasan et al. |
| 2004/0065976 | A1 | 4/2004 | Sreenivasan et al. |
| 2004/0124092 | A1 | 7/2004 | Black et al. |
| 2005/0064344 | A1 | 3/2005 | Bailey et al. |
| 2005/0084804 | A1 | 4/2005 | Truskett et al. |
| 2005/0189676 | A1 | 9/2005 | Sreenivasan |
| 2005/0230882 | A1 | 10/2005 | Watts et al. |
| 2006/0019183 | A1 | 1/2006 | Voisin |
| 2006/0113697 | A1 | 6/2006 | Sreenivasan |
| 2006/0134556 | A1 | 6/2006 | Nealey et al. |
| 2007/0183025 | A1 | 8/2007 | Asakawa et al. |
| 2007/0281220 | A1* | 12/2007 | Sandhu et al. .................... 430/5 |
| 2008/0095878 | A1 | 4/2008 | Bailey et al. |
| 2009/0130598 | A1 | 5/2009 | Schmid et al. |
| 2009/0166933 | A1 | 7/2009 | Sreenivasan |
| 2009/0212012 | A1 | 8/2009 | Brooks et al. |
| 2010/0015270 | A1 | 1/2010 | Choi et al. |

FOREIGN PATENT DOCUMENTS

| | | |
|---|---|---|
| WO | WO 2008/096335 | 8/2008 |
| WO | WO 2008/130847 | 10/2008 |
| WO | WO 2008/156977 | 12/2008 |
| WO | WO 2009/099924 | 8/2009 |

OTHER PUBLICATIONS

Stoykovich et al., Block copolymers and conventional lithography, Materials Today, Elsevier Science, Kidlington GB. vol. 9 No. 9 pp. 20-29 Sep. 1, 2006.

Jung et al., Orientation-Controlled Self-Assembled Nanolithography Using a Polystyrene-Polydimethylsiloxane Block Copolymer; Nano Letters, vol. 7, No. 7, pp. 2046-2050 (2007) Apr. 19, 2007.

Bates et al., Block Copolymer Thermodynamics: Theory and Experiment; Annu. Rev. Phys. Chem., vol. 41, pp. 525-557, 1990.

Guarini et al., Nanoscale patterning using self-assembled polymers for semiconductor applications; J. Vacuum Sci. Technol. B., (2001) vol. 19, No. 6, pp. 2784-2788; Oct. 8, 2001.

Taylor et al., Gas-Phase Functionalized Plasma-Developed Resists: Initial Concepts and Results for Electron-Beam Exposure; J. Electrochemical Soc., vol. 131, No. 7, (1984) pp. 1658-1664; Jul. 1, 1984.

Ruiz et al., Density Multiplication and Improved Lithography by Directed Block Copolymer Assembly; Science, vol. 321 (2008), pp. 936-939; Aug. 15, 2008.

* cited by examiner

IMPRINT LITHOGRAPHY TEMPLATE

CROSS-REFERENCE TO RELATED APPLICATIONS

This application claims the benefit under 35 U.S.C. §119(e)(1) of U.S. Provisional Patent Application No. 61/108,636, filed Oct. 27, 2008, which is hereby incorporated by reference herein in its entirety.

BACKGROUND INFORMATION

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate, therefore nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

An exemplary nano-fabrication technique in use today is commonly referred to as imprint lithography. Exemplary imprint lithography processes are described in detail in numerous publications, such as U.S. Patent Publication No. 2004/0065976, U.S. Patent Publication No. 2004/0065252, and U.S. Pat. No. 6,936,194, all of which are hereby incorporated by reference.

An imprint lithography technique disclosed in each of the aforementioned U.S. patent publications and patent includes formation of a relief pattern in a polymerizable layer and transferring a pattern corresponding to the relief pattern into an underlying substrate. The substrate may be coupled to a motion stage to obtain a desired positioning to facilitate the patterning process. The patterning process uses a template spaced apart from the substrate and a formable liquid applied between the template and the substrate. The formable liquid is solidified to form a rigid layer that has a pattern conforming to a shape of the surface of the template that contacts the formable liquid. After solidification, the template is separated from the rigid layer such that the template and the substrate are spaced apart. The substrate and the solidified layer are then subjected to additional processes to transfer a relief image into the substrate that corresponds to the pattern in the solidified layer.

BRIEF DESCRIPTION OF DRAWINGS

So that the present invention may be understood in more detail, a description of embodiments of the invention is provided with reference to the embodiments illustrated in the appended drawings. It is to be noted, however, that the appended drawings illustrate only typical embodiments of the invention, and are therefore not to be considered limiting of the scope.

DETAILED DESCRIPTION

Figure 1:
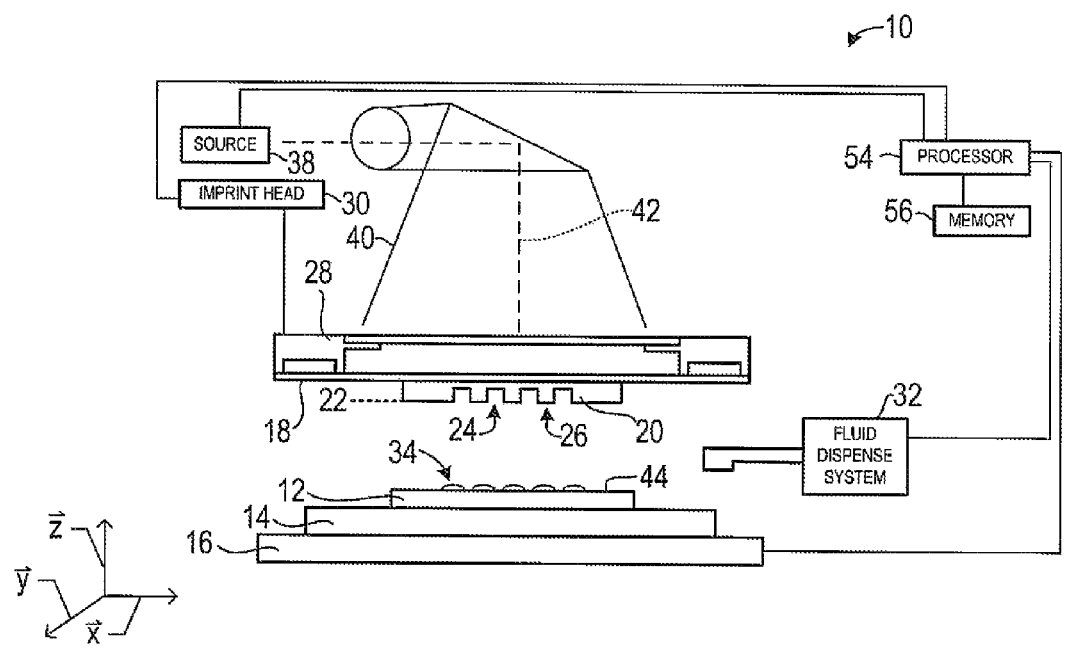
FIG. 1 illustrates a simplified side view of one embodiment of a lithographic system in accordance with the present invention.

Referring to the figures, and particularly to FIG. 1, illustrated therein is a lithographic system 10 used to form a relief pattern on substrate 12. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electromagnetic, and/or the like. Exemplary chucks are described in U.S. Pat. No. 6,873,087, which is hereby incorporated by reference.

Substrate 12 and substrate chuck 14 may be further supported by stage 16. Stage 16 may provide motion abut along the x-, y-, and z-axes. Stage 16, substrate 12, and substrate chuck 14 may also be positioned on a base (not shown).

Spaced-apart from substrate 12 is a template 18. Template 18 generally includes a mesa 20 extending therefrom towards substrate 12, mesa 20 having a patterning surface 22 thereon. Further, mesa 20 may be referred to as mold 20. Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. As illustrated, patterning surface 22 comprises features defined by a plurality of spaced-apart recesses 24 and/or protrusions 26, though embodiments of the present invention are not limited to such configurations. Patterning surface 22 may define any original pattern that forms the basis of a pattern to be formed on substrate 12.

Template 18 may be coupled to chuck 28. Chuck 28 may be configured as, but not limited to, vacuum, pin-type, groove-type, electromagnetic, and/or other similar chuck types. Exemplary chucks are further described in U.S. Pat. No. 6,873,087, which is hereby incorporated by reference. Further, chuck 28 may be coupled to imprint head 30 such that chuck 28 and/or imprint head 30 may be configured to facilitate movement of template 18.

System 10 may further comprise a fluid dispense system 32. Fluid dispense system 32 may be used to deposit polymerizable material 34 on substrate 12. Polymerizable material 34 may be positioned upon substrate 12 using techniques such as drop dispense, spin-coating, dip coating, chemical vapor deposition (CVD), physical vapor deposition (PVD), thin film deposition, thick film deposition, and/or the like. Polymerizable material 34 may be disposed upon substrate 12 before and/or after a desired volume is defined between mold 20 and substrate 12 depending on design considerations. Polymerizable material 34 may comprise a monomer as described in U.S. Pat. No. 7,157,036 and U.S. Patent Publication No. 2005/0187339, all of which are hereby incorporated by reference.

Figure 2:
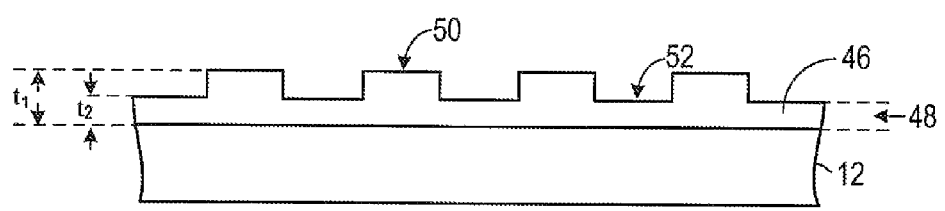
FIG. 2 illustrates a simplified side view of the substrate shown in FIG. 1 having a patterned layer positioned thereon.

Referring to FIGS. 1 and 2, system 10 may further comprise an energy source 38 coupled to direct energy 40 along path 42. Imprint head 18 and stage 16 may be configured to position template 18 and substrate 12 in superimposition with path 42. System 10 may be regulated by a processor 54 in communication with stage 16, imprint head 30, fluid dispense system 32, and/or source 38, and may operate on a computer readable program stored in memory 56.

Either imprint head 30, stage 16, or both vary a distance between mold 20 and substrate 12 to define a desired volume therebetween that is filled by polymerizable material 34. For example, imprint head 30 may apply a force to template 18 such that mold 20 contacts polymerizable material 34. After the desired volume is filled with polymerizable material 34, source 38 produces energy 40, e.g., broadband ultraviolet radiation, causing polymerizable material 34 to solidify and/or cross-link conforming to shape of a surface 44 of substrate 12 and patterning surface 22, defining a patterned layer 46 on substrate 12. Patterned layer 46 may comprise a residual layer 48 and a plurality of features shown as protrusions 50 and recessions 52, with protrusions 50 having thickness $t_1$ and residual layer having a thickness $t_2$.

The above-mentioned system and process may be further employed in imprint lithography processes and systems referred to in U.S. Pat. No. 6,932,934, U.S. Patent Publication No. 2004/0124566, U.S. Patent Publication No. 2004/0188381, and U.S. Patent Publication No. 2004/0211754, each of which is hereby incorporated by reference.

Block copolymer materials may be used in the fabrication of imprint lithography templates 18. For example, solutions containing block copolymers may be processed to form thin films that have chemical patterns. The size, shape, and type of pattern that is formed in the thin film may be characteristic of the polymer composition (e.g., one or more domains). In some implementations, it is possible to create patterns that form regular arrays covering large areas. These materials may be used to fabricate imprint lithography templates 18 containing structures with very high resolution patterns.

Block copolymers are polymers having two or more chemically distinct repeating units herein referred to as domains, with each distinct repeating unit grouped together in a block. For example, diblock copolymers may contain two types of domains. Triblock copolymers may contain three types of domains, and multi-block copolymers may contain any number of copolymers.

Polymeric systems having differing chemical composition generally are not miscible; rather, the different components tend to undergo micro-phase separation to minimize interfacial area between the multiple phases. For example, in the case of a block copolymer, the process of phase separation may be limited as the two (or more) chemical components may be covalently linked within a single polymer molecule. Under certain processing conditions, these systems may be induced to form regular arrays of spheres, cylinders, lamellae, or other complex patterns. Exemplary systems are further described in U.S. Patent Publication No. 2007/0183025, Frank S. Bates and Glenn H. Fredrickson, "Block Copolymer Thermodynamics: Theory and Experiment", Annu. Rev. Phys. Chem., vol. 41, pp 525-557 (1990), and Ruiz, R., H. Kang, F. A. Detcheverry, E. Dobisz, D. S. Kercher, T. R. Albrecht, J. J. de Pablo, and P. F. Nealey, "Density Multiplication and Improved Lithography by Directed Block Copolymer Assembly", Science, vol. 321, pp 936-939 (2008), which are hereby incorporated by reference in their entirety.

Figure 3:
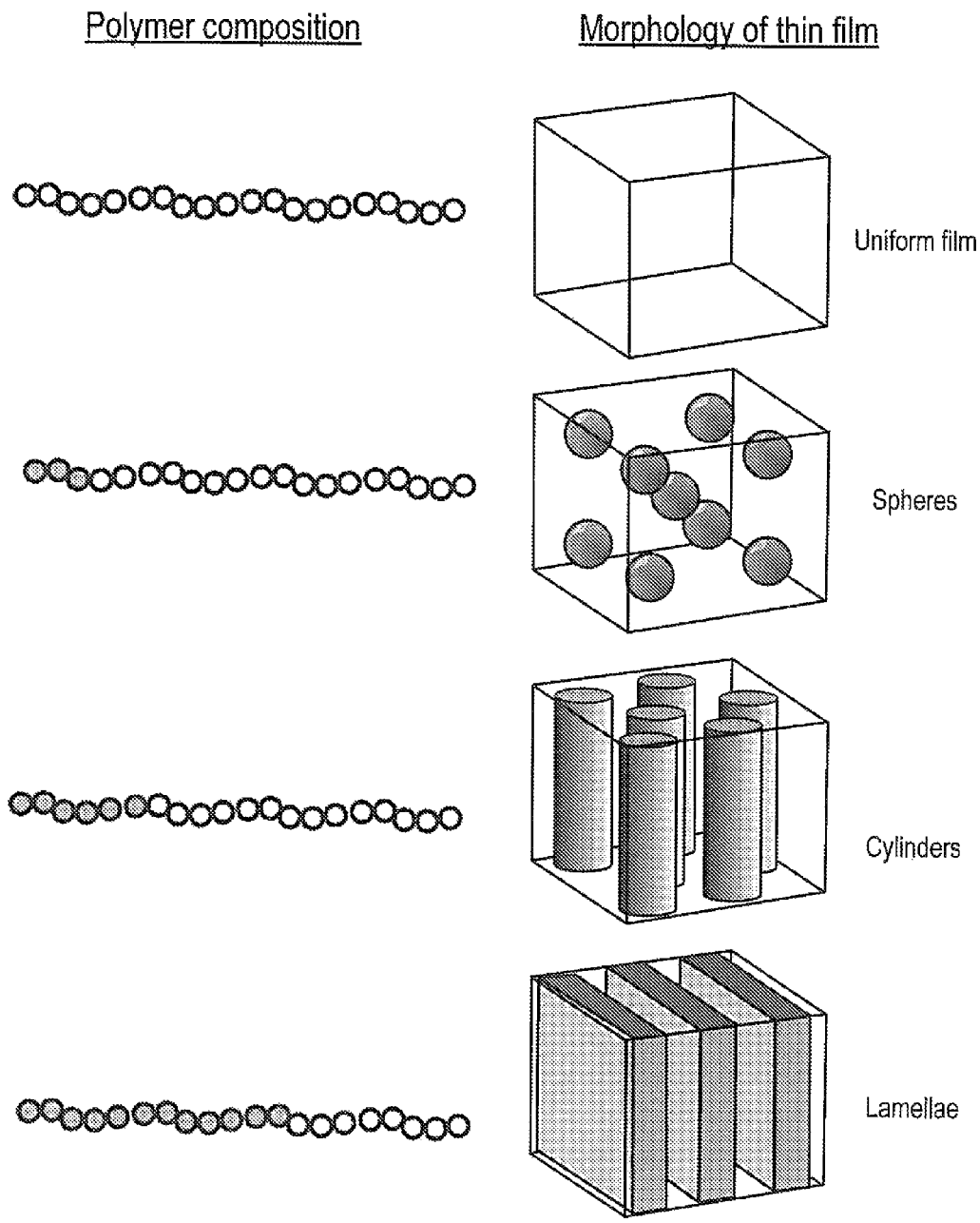
FIG. 3 illustrates exemplary phase morphologies of block copolymer layer.
Figure 4:
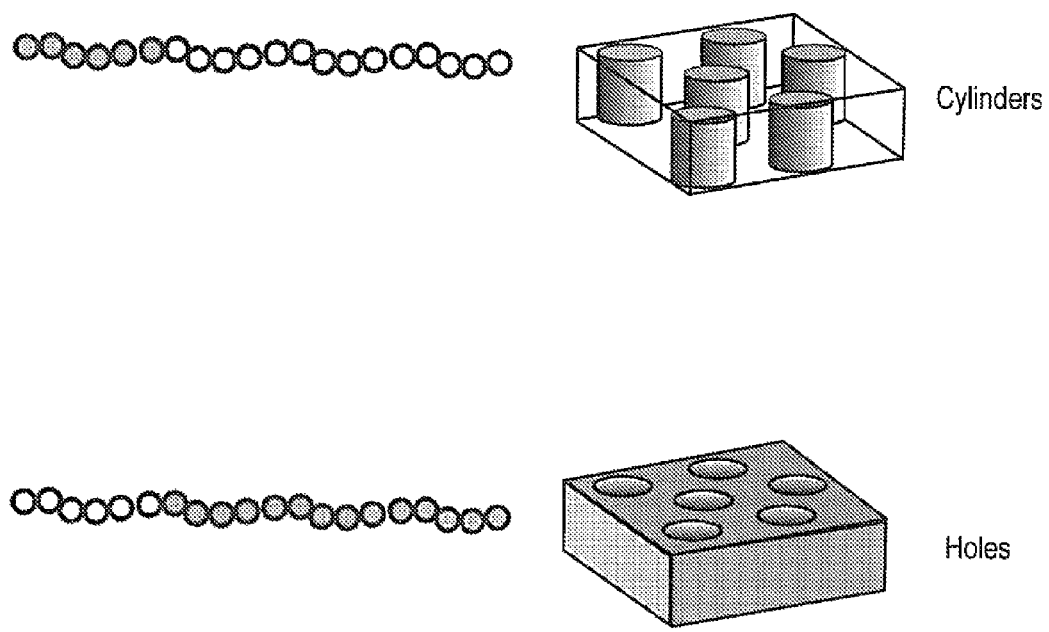
FIG. 4 illustrates exemplary formation of an array of cylinders and an array of holes by adjusting volume fraction composition of a polymer.

FIG. 3 illustrates exemplary phase morphologies for thin films of block copolymers. Size, shape, and/or uniformity of the pattern may be related to the chemical composition of the polymer. For example, a polymer with uniform composition (i.e., one domain) may generally form a uniform film. A diblock copolymer, however, may contain a volume of a first domain (e.g., a small volume fraction of a minority component) and a volume of a second domain (e.g., a large volume of a majority component). For example, regular arrays of spheres of the first domain may be induced to form within a matrix of the second domain. As the volume fraction of the first domain is increased, the morphology of the film may alter. For example, the morphology of the film may provide for cylinders and/or lamellae. The phase morphology may be symmetric with respect to the composition of the first domain and/or second domain, such that an array of cylinders and/or an array of holes may be formed by adjusting the volume fraction composition of the polymer as shown in FIG. 4. Adjustment of the chain length of the polymers may adjust the period of the pattern.

Figure 5A:
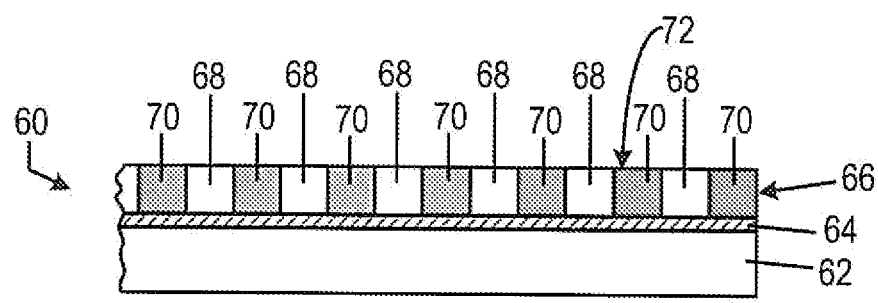
FIG. 5A-5B illustrate exemplary formation of a pattern in a block copolymer layer.
Figure 5B:
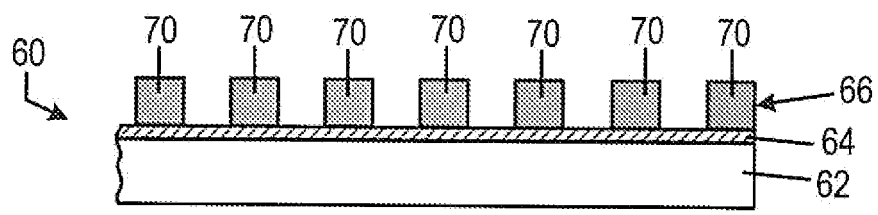

FIGS. 5A-5B illustrate an exemplary method of forming template 18 using a block copolymer. Template 18 may be formed of a multi-layer substrate 60. Multi-layer substrate may include a substrate layer 62, an adhesion layer 64, and a block copolymer layer 66.

Referring to FIG. 5A, substrate layer 64 may be formed of materials including, but not limited to fused silica, quartz, fused quartz, silicon, borosilicate glass, and/or the like. Surface energy of substrate layer 64 may be controlled to provide desired orientation of morphology of block copolymer layer 66. As such, adhesion layer 64 may be provided on surface of substrate layer 64. Adhesion layer 64 may be positioned on substrate layer 64 using techniques including, but not limited to, spin coating and baking, vapor phase deposition (e.g., grafting), vacuum deposition (e.g., evaporation, sputtering), and/or the like. Adhesion layer 64 may have a thickness $t_2$. In one example, thickness $t_2$ of adhesion layer 64 may be less than approximately five nm.

Adhesion layer 64 may be neutral towards block copolymer layer 66 or may have a thermodynamically favorable interaction with at least one domain of block copolymer layer 66. In one example, adhesion layer 64 may be a copolymer having similar monomeric components to at least one domain 68 or 70 of block copolymer layer 66. In another example, adhesion layer 64 may be a grafted polymer brush. Two domains 68 and 70 are illustrated in FIG. 5A, however, additional domains may be used in accordance with the present invention.

Block copolymer layer 66 may be positioned on adhesion layer 64. For example, block copolymer layer 66 may be positioned on adhesion layer 64 using techniques including, but not limited to, spin coating and baking, vapor phase deposition (e.g., grafting), vacuum deposition (e.g., evaporation, sputtering), droplet-dispense and/or the like.

Referring to FIG. 5A, block copolymer layer 66 may be processed to induce formation of a chemical pattern in block copolymer layer 66. For example, pattern formation may be provided by an annealing process in which thermal motion induces polymer chains to achieve a thermodynamically favorable configuration. Pattern formation may be increased by processing at elevated temperatures and/or by processing in an environment that contains a molecular agent that has an effect (e.g., plasticizing effect) on block copolymer layer 66.

Block copolymer layer 66 may have a thickness $t_3$. Thickness $t_3$ of block copolymer layer 66 may be adapted to provide desired morphology of block copolymer layer 66 during alteration of composition state.

During pattern formation in block copolymer layer 66, uniformity of resulting dimensions and/or orientation of phase morphology may be controlled. For example, block copolymer layer 66 may include a substantially homogeneous composition; i.e., the polymer system may be highly mono-disperse in both molecular weight and block composition provided by substantially precise polymer synthesis. In another example, block copolymer layer 66 may include an energetic driving force toward self-assembly (e.g., Flory-Huggins χ parameter), relating to the energy needed to intersperse polymer molecules. In another example, uniform alteration of composition state may be enhanced by tuning interactions at an interface between substrate layer 62 and block copolymer layer 66, and/or between exposed surface 72 of block copolymer layer 66 and block copolymer layer. In another example, block copolymer layer 66 may undergo conformational reorganization at the molecular level bringing the system closer to thermodynamic equilibrium. Alterations in composition state may be achieved in laboratory conditions on reasonable time scales. In another example, morphology of alteration in composition state may be oriented toward a pre-existing pattern on substrate layer 62 (e.g., spatial variation in the surface chemistry and/or a spatial variation in topography).

Referring to FIG. 5B, block copolymer layer 66 may be processed to induce at least one domain 68 or 70 to alter composition states to provide a pattern (e.g., protrusions and recessions) in block copolymer layer 66. For example, in FIG. 5B, block copolymer layer 66 may be processed to induce domain 68 to alter composition states. Alteration in composition state may occur by thermal reactivity and/or chemical reactivity.

The pattern formed in block copolymer layer 66 by alteration of composition state of at least one domain 68 or 70 may be further subjected to additional processes to form template 18. FIGS. 6-10 illustrate methods for transferring the pattern formed in block copolymer layer 66 to form template 18.

FIGS. 6A-6E illustrate pattern transfer of the pattern formed in block copolymer layer 66 via a lift-off process. Other researchers have reported the use of block copolymer self assembly to create patterns of metal dots with a lift-off process. For example, see Guarini, K. W., C. T. Black, K. R. Milkove, and R. T. Sandstrom, "Nanoscale patterning using self-assembled polymers for semiconductor applications", J. Vacuum Sci. Technol. B., vol. 19, no. 6, pp. 2784-2788 (2001), which is hereby incorporated by reference in its entirety; however, these reports indicate the lift-off process may have limitations. Embodiments of the present invention use an advanced lift-off process with a self-assembling block copolymer. The lift-off and pattern transfer processes may be based on techniques further described in U.S. Ser. No. 11/856,862 and U.S. Ser. No. 11/943,907, both of which are hereby incorporated by reference in their entirety.

Figure 6A:
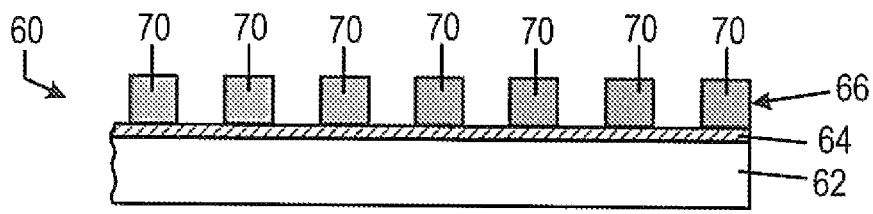
FIGS. 6A-6E illustrate an exemplary method for transfer of a pattern.

Referring to FIG. 6A, one domain 68 may be selectively removed using alteration of composition state as described in relation to FIGS. 5A and 5B. For example, block copolymer layer 66 may be formed of poly (styrene-block-methylmethacrylate), or PS-b-PMMA. After self-assembly, block copolymer layer 66 may be exposed to ultraviolet light degrading the PMMA block and/or cross-linking the PS block. The PMMA portion may then be removed by dissolution in a polar solvent such as acetic acid using techniques described in further detail by Guarini, K. W., C. T. Black, K. R. Milkove, and R. T. Sandstrom, "Nanoscale patterning using self-assembled polymers for semiconductor applications", J. Vacuum Sci. Technol. B., vol. 19, no. 6, pp. 2784-2788 (2001), which is hereby incorporated by reference in its entirety. After at least one domain 68 or 70 has been selectively removed, an etch process may be performed to remove the exposed portions of adhesion layer 64. Substrate layer 66 may then be processed with an etch-enhanced lift-off process.

Figure 6B:
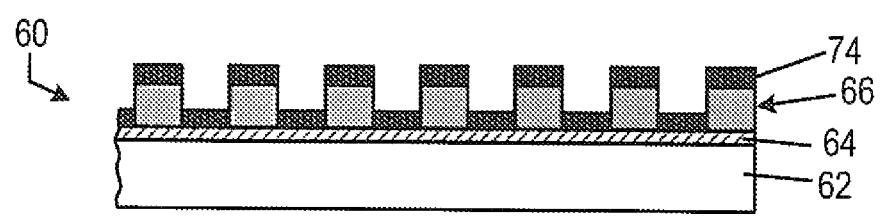

Referring to FIG. 6B, a mask layer 74 (e.g., chromium) may be deposited on multi-layer substrate 60. Deposition of mask layer 74 may be a directional coating (e.g., deposition on horizontal surfaces) or a confirmation coating (e.g., deposition on horizontal and vertical surfaces). Deposition may be provided by techniques including, but not limited to, vacuum evaporation, and the like.

Figure 6C:
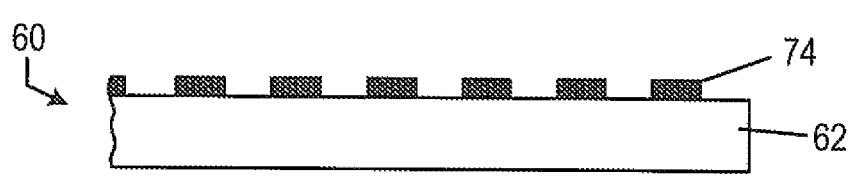

Referring to FIG. 6C, remaining domain of block copolymer layer 70, adhesion layer 64, and portions of mask layer 74 may be removed. For example, mask layer 74 may be selectively removed and/or degraded using an isotropic dry etch process (e.g., reactive ion etching in plasma that contains chlorine and oxygen). Remaining domain 70 of block copolymer layer 70 may then be removed resulting in a patterned mask layer 74. For example, remaining domain 70 of block copolymer layer 70 may be removed by dissolution in a solvent resulting in a pattern of mask layer 74 corresponding to the pattern provided in block copolymer layer 66.

Figure 6D:
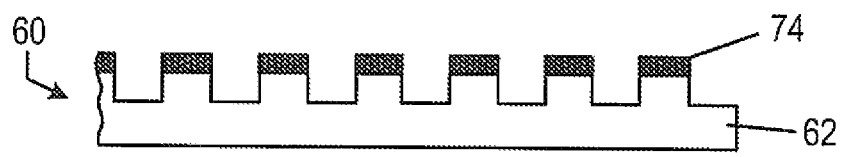
Figure 6E:
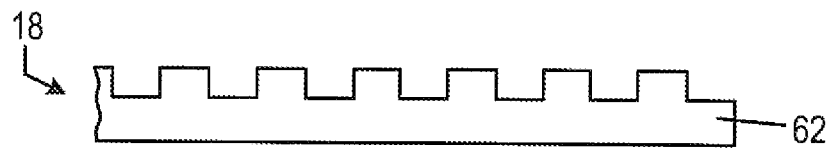

Referring to FIGS. 6D and 6E, the pattern of mask layer 74 may be used as an etch mask for patterning substrate layer 62 to form template 18. In one embodiment, mask layer 74 (e.g., Cr) may use a reactive ion etching process (e.g., process employing a fluorocarbon plasma) to etch the underlying substrate layer 62 (e.g., fused silica). Template 18 may be used in an imprint lithography system and process as described in relation to FIGS. 1 and 2.

FIGS. 7A-7D illustrate another exemplary method for pattern transfer of the pattern formed in block copolymer layer 66 via a direct etch process. Similar to FIGS. 5A and 5B, multi-layer substrate 60a includes substrate layer 62, adhesion layer 64 and block copolymer layer 66 having multiple domains 68 and 70. Multi-layer substrate 60a also includes an etch mask layer 80. Etch mask layer 80 may facilitate robust pattern transfer. Etch mask layer 80 may be formed of materials including, but not limited to, chromium, silicon, silicon dioxide, silicon nitride, tantalum, molybdenum, tungsten, titanium, and the like.

Figure 7A:
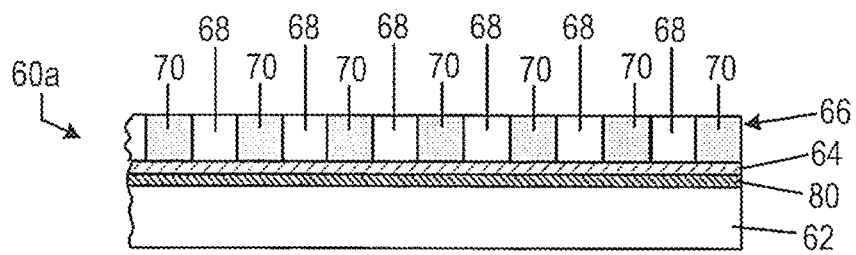
FIGS. 7A-7D illustrate an exemplary method for transfer of a pattern.

Referring to FIG. 7A, adhesion layer 64 may be deposited on the etch mask layer 80. Block copolymer layer 66 may be deposited on adhesion layer 64 and annealed.

Figure 7B:
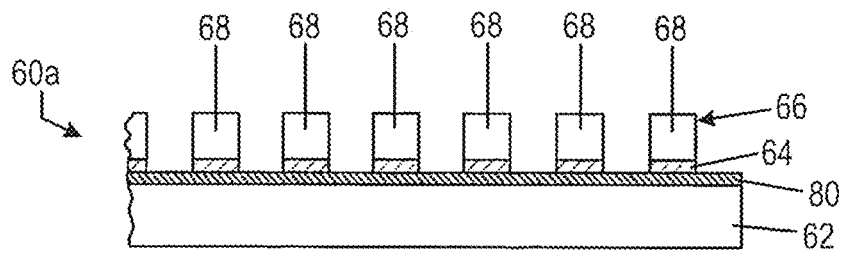

Referring to FIG. 7B, at least one domain 68 or 70 of block copolymer layer 66 may be selectively removed by alteration in composition state exposing portions of adhesion layer 64. For example, block copolymer layer 66 may comprise PS-b-PMMA. After self-assembly, block copolymer layer 66 may be exposed to ultraviolet light degrading the PMMA block and/or cross-linking the PS block. The PMMA portion (e.g., domain 70) may then be removed by dissolution in a polar solvent such as acetic acid. In another example, block copolymer layer 66 may comprise poly (styrene-block-dimethylsiloxane), or PS-b-PDMS. After self-assembly, the PS phase may be removed by reactive ion etching in a plasma that contains oxygen. Additional etch processing may be used to remove thin layers of PDMS that form near the top and bottom interfaces of the film. (Etch transfer of patterns from PS-b-PDMS has been previously reported. For example, see Jung, Y. S. and C. A. Ross, "Orientation-Controlled Self-Assembled Nanolithography using a polystyrene-polydimethylsiloxane block copolymer", Nano Letters, Vol. 7, No. 7, pp 2046-2050 (2007), which is hereby incorporated by reference in its entirety.

Figure 7C:
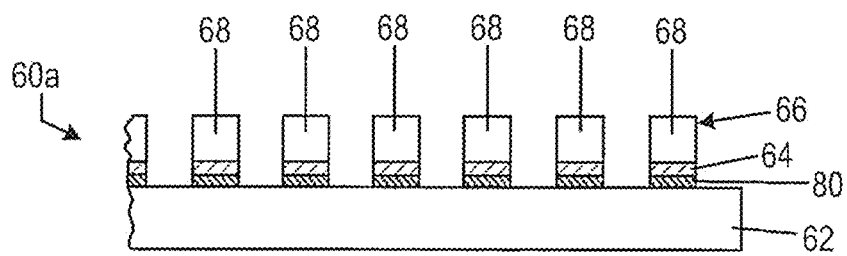

Referring to FIGS. 7B and 7C, after selective removal of at least one domain 68 or 70, a descum etch process may be used to remove exposed portions of the adhesion layer 64. The pattern that is present in the remaining domain (e.g., domain

68) may be etch transferred into etch mask layer 80 (e.g., a reactive ion etch transfer process). In one embodiment, etch mask layer 80 includes Cr and the reactive ion etch process employs a plasma that contains chlorine and oxygen.

Figure 7D:
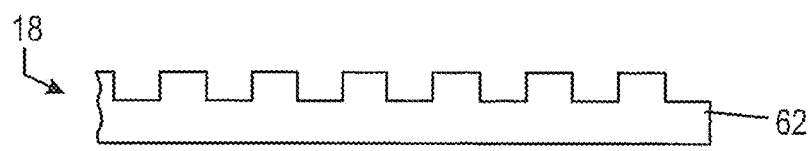

Referring to FIGS. 7C and 7D, after the pattern has been etched into etch mask layer 80, the pattern may be transferred into substrate layer 62 (e.g., a reaction ion etch process) forming template 18. In one embodiment, etch mask layer 80 (e.g., Cr) may use a reactive ion etching process (e.g., process employing a fluorocarbon plasma) to etch the underlying substrate layer 62 (e.g., fused silica).

Figure 8A:
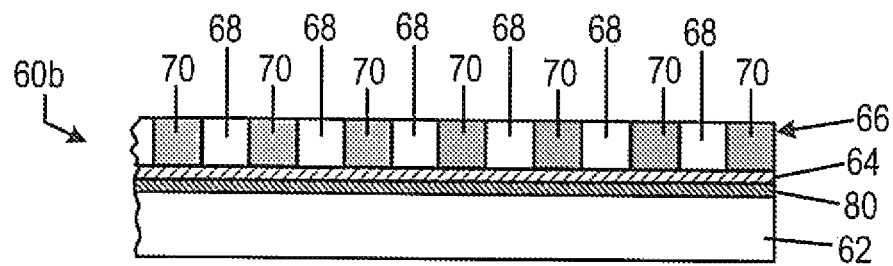
FIGS. 8A-8G illustrate an exemplary method for transfer of a pattern.

FIGS. 8A-8G illustrate another exemplary method for pattern transfer of the pattern formed in block copolymer layer 66. Similar to FIGS. 7A-7D, etch mask layer 80 may be deposited on substrate layer 62. Etch mask layer 80 may be coated with adhesion layer 64 having material with a favorable interaction with block copolymer layer 66. Block copolymer layer 66 may be deposited on adhesion layer 64 and annealed as shown in FIG. 8A.

Figure 8B:
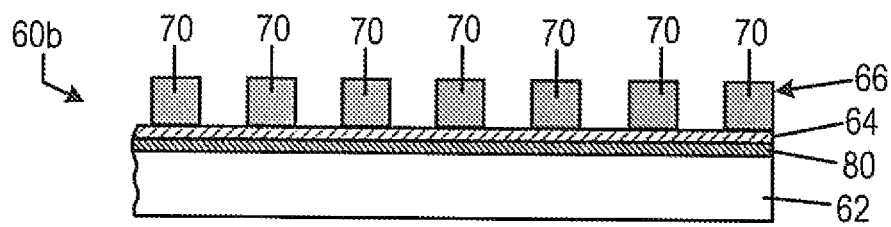

Referring to FIG. 8B, one domain (e.g., domain 68) of block copolymer may be selectively removed by alteration of composition state using methods described herein. Selective removal of domain 68 may expose portions of adhesion layer 64.

Figure 8C:
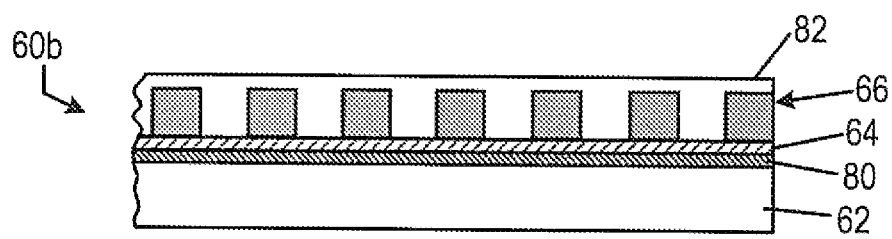

Referring to FIG. 8C, after selective removal of domain 68, a descum etch may be employed to remove exposed portions adhesion layer 64. Remaining domain 70 may be coated with a planarizing layer 82 (i.e. material layer that is substantially planarizing). Planarizing layer 82 may be deposited by droplet-dispense, spin coating, and/or the like. Planarizing layer 82 may be formed of material with substantial resistance to a reactive ion etching process. For example, planarizing layer 82 may contain >10 percent silicon on a mass basis.

Figure 8D:
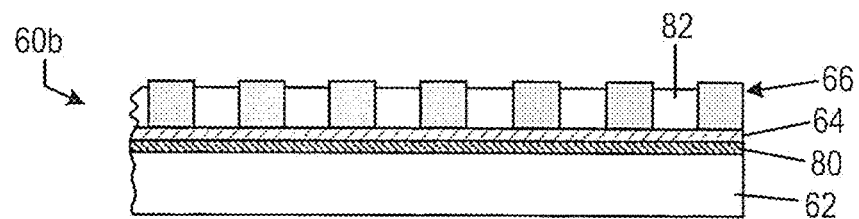

Referring to FIG. 8D, a first etch process may be employed to selectively remove planarizing layer 82 exposing portions of block copolymer layer 66.

Figure 8E:
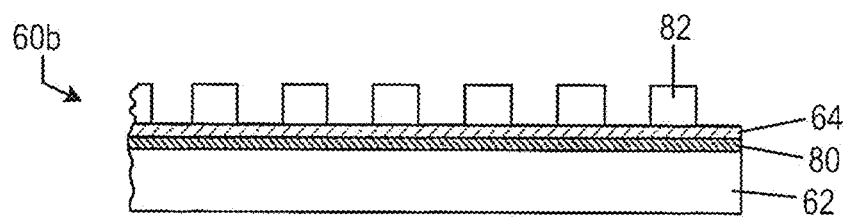
Figure 8F:
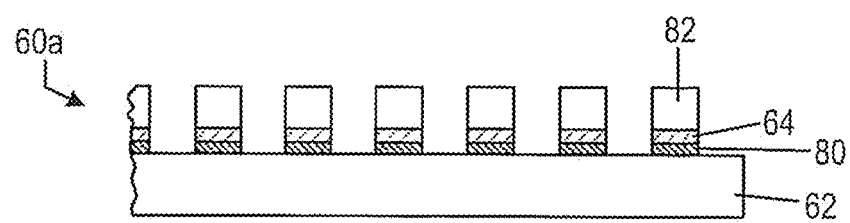
Figure 8G:
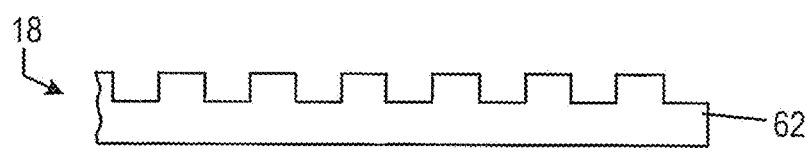

Referring to FIG. 8E, a second etch process may be used to selectively remove remaining portions of block copolymer layer 66. Remaining planarizing layer 82 may be used as an etch mask to pattern etch mask layer 80 as shown in FIG. 8F. Referring to FIG. 8G, etch mask layer 80 may be used to pattern substrate layer 62 forming template 18.

FIGS. 9 and 10 illustrate another exemplary method for pattern transfer of the pattern formed in block copolymer layer 66. In particular, FIGS. 9 and 10 illustrate exemplary methods of increasing etch resistance of block copolymer layer 66 by altering composition state of at least one domain 68 or 70. For example, composition state of domain 68 may be altered providing domain 68a. Pattern transfer via reactive ion etching may be facilitated by etch selectivity between domains 68a and 70 of block copolymer layer 66. For example, in the system PS-b-PDMS the PDMS domain may have a high concentration of silicon, while the PS domain does not contain silicon. The chemical pattern in silicon concentration corresponds to a high PS/PDMS etch selectivity in a plasma that contains oxygen. Etch selectivity of the chemical patterns may be increased by reactive modification during and/or after the self-assembly process.

In one embodiment, block copolymer layer 66 may be prepared having at least one domain with a hydroxyl functionality and at least one domain without a hydroxyl functionality. In one embodiment, the polymer may consist of poly(styrene-block-hydroxyethylmethacrylate), or PS-b-PHEMA. A hydroxyl group may be processed to incorporate silicon via reaction from a vapor phase silylating agent, typically at elevated temperature and reduced pressure. Examples of vapor phase silylating agents include hexamethyldisilazane (HMDS), dimethylsilyldimethylamine (DMSDMA), dimethylsilyldiethylamine (DMSDEA), and dimethyldisilyldimethylamine (DMDSDMA).

In another embodiment, block copolymer layer 66 may contain at least one domain with an alkene functional group, and at least one domain without an alkene functional group. In one example, the polymer system comprises poly(styrene-block-butadiene), which reacts with diborane in the vapor phase to incorporate boron into the alkene phase.

Incorporation of etch resistance from a vapor phase reactant has been previously proposed for lithography applications. For example, see Taylor, G. N., L. E. Stillwagon, and T. Venkatesan, "Gas-Phase Functionalized Plasma-Developed Resists Initial Concepts and Results for Electron-Beam Exposure", J. Electrochemical Soc., vol. 131, no. 7, pp. 1658-1664 (1984), which is hereby incorporated by reference in its entirety. These previous reports have employed photolithographic or electron-beam lithography approaches to produce the initial pattern of reactive components within the film. Such approaches may be limited, for example, by blur that may be caused by diffraction or electron beam scattering. As such, functionalization may be difficult with sufficient selectivity between the nominally "reactive" and "non-reactive" regions: Etch-resistant species are sparsely incorporated in regions that must be etched. This results in high patterning roughness and feature non-uniformity. Block copolymer self-assembly may avoid high patterning roughness and feature non-uniformity as initial chemical pattern may be naturally formed by phase separation processes, and/or sharp transitions in chemical composition may be achieved.

Figure 10A:
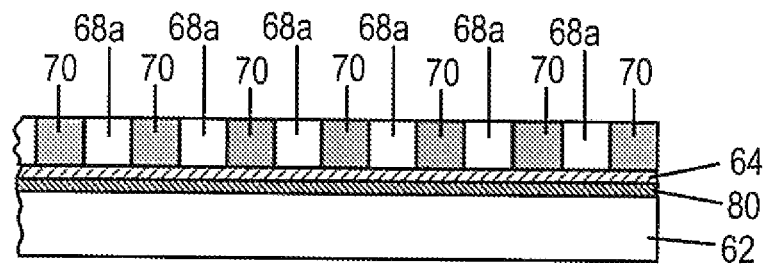
Figure 10B:
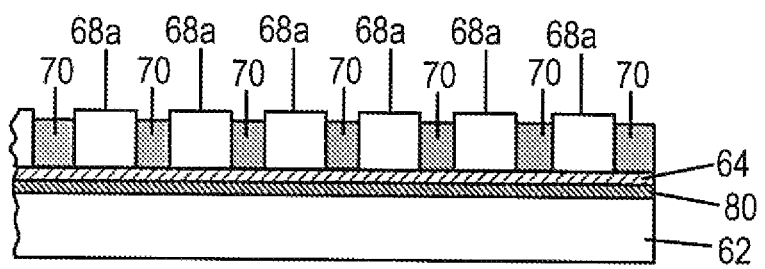
Figure 10C:
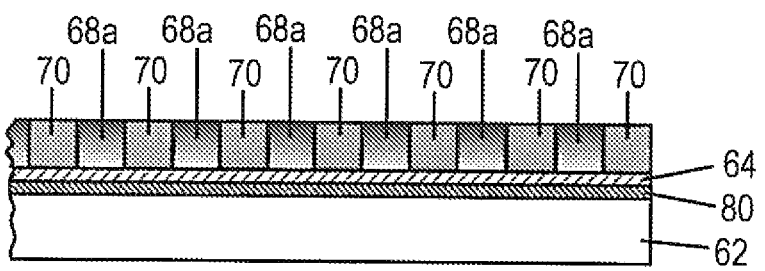

Referring to FIGS. 10A-10C, reactive modification of the etch properties generally entails the addition of an etch-resistant moiety into certain regions of the film. In some embodiments, this reaction may effect little change in mass and the dimensions of the pattern will remain essentially unchanged, as shown in FIG. 10A. In other embodiments, the addition of mass may cause a significant change in pattern dimensions, as shown in FIG. 10B. The change in pattern dimensions may occur in both lateral and thickness dimensions. In further embodiments, the chemical reaction may be non-uniformly distributed through the thin film, as shown in FIG. 10C.

Figure 9A:
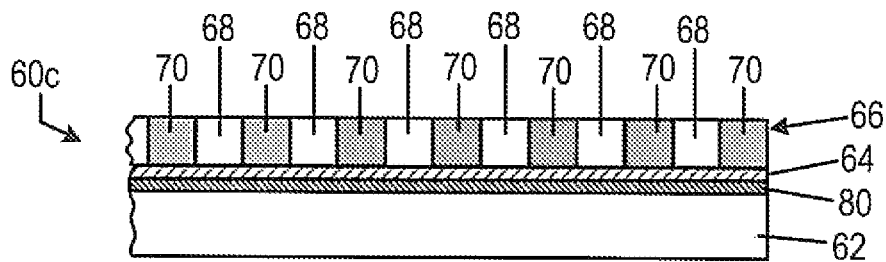
FIGS. 9A-9E and FIGS. 10A-10C illustrate an exemplary method for increasing etch resistance of a block copolymer layer.
Figure 9B:
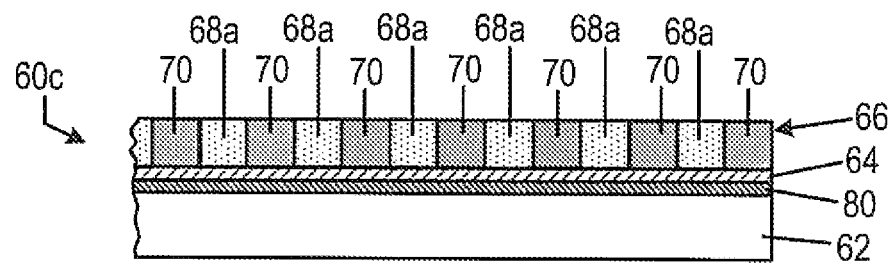

Referring to FIG. 9B, one domain (e.g., domain 70) of block copolymer may be selectively removed by alteration of composition state using methods described herein. Selective removal of domain 70 may expose portions of adhesion layer 64.

Figure 9C:
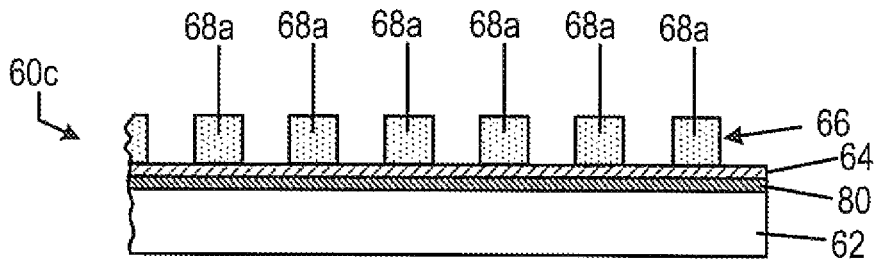

Referring to FIG. 9C, after selective removal of at least one domain 70, a descum etch process may be used to remove exposed portions of the adhesion layer 64. The pattern that is present in the remaining domain (e.g., domain 68a) may be etch transferred into etch mask layer 80 (e.g., a reactive ion etch transfer process). In one embodiment, etch mask layer 80 includes Cr and the reactive ion etch process employs a plasma that contains chlorine and oxygen.

Figure 9D:
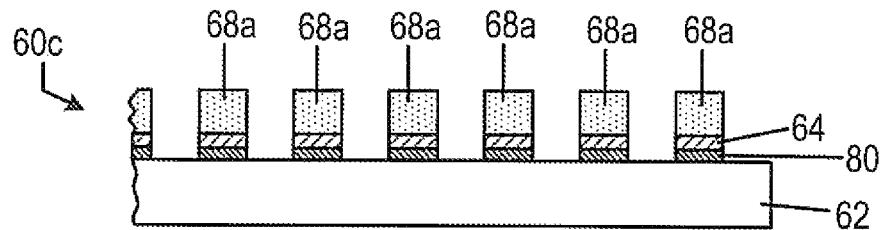
Figure 9E:
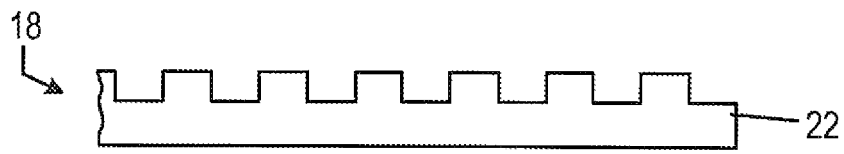

Referring to FIGS. 9D and 9E, after the pattern has been etched into etch mask layer 80, the pattern may be transferred into substrate layer 62 (e.g., a reaction ion etch process) forming template 18. In one embodiment, etch mask layer 80 (e.g., Cr) may use a reactive ion etching process (e.g., process employing a fluorocarbon plasma) to etch the underlying substrate layer 62 (e.g., fused silica).

What is claimed is:
1. A method, comprising:
    forming a block copolymer layer on a substrate, the block copolymer layer having a first domain and a second domain, the first domain associated with a first compo- sition state having a first etch resistance, and the second domain associated with a second composition state;

performing a first process on the block copolymer layer, the performing including:

altering, by thermal reactivity, chemical reactivity, or both, the first composition state associated with the first domain to a third composition state having a second etch resistance, the second etch resistance greater than the first etch resistance;

increasing, based on the altering, an etch selectivity between the first domain and the second domain;

removing, based on the increased etch selectivity, portions of the block copolymer layer associated with the first domain to provide one or more recessions;

maintaining the second composition state associated with the second domain to provide one or more protrusions;

in response to performing the first process, forming a pattern in the block copolymer layer, the pattern including the one or more recessions and the one or more protrusions; and, transferring the pattern in the block copolymer layer to the substrate forming an imprint lithography template.

2. The method of claim 1, wherein the first process is an etching process.

3. The method of claim 1, wherein the first process is an exposure process.

4. The method of claim 1, wherein the first process is a chemical reaction.

5. The method of claim 1, wherein transferring the pattern includes a direct etch process.

6. The method of claim 1, wherein transferring the pattern includes a lift-off process.

7. The method of claim 1, further comprising performing a second process affecting the composition state of the second domain.

8. The method of claim 7, wherein the second process provides minimal alterations in mass and dimension of the pattern.

9. The method of claim 7, wherein the second process provides significant alterations in dimensions of the pattern.

10. The method of claim 9, wherein the alterations include lateral alterations in the pattern.

11. The method of claim 9, wherein the alterations include thickness alterations in the pattern.

12. The method of claim 7, wherein the second process is a chemical reaction non-uniformly distributed through the block copolymer layer.

13. A method, comprising:

forming a block copolymer layer on a substrate layer, the block copolymer layer having a plurality of domains, each domain associated with an initial composition state and an initial etch resistance;

subjecting the block copolymer layer to a first process, the first process including:

altering, by thermal reactivity, chemical reactivity, or both, the initial composition state associated with a subset of the plurality of domains, the altered composition state of the subset of the plurality of domains having an altered etch resistance, the altered etch resistance greater than the initial etch resistance;

increasing, based on the altering, an etch selectivity between the subset of the plurality of domains and remaining domains of the plurality of domains;

removing, based on the increased etch selectivity, portions of the block copolymer layer associated with the subset of the plurality of domains to provide one or more recessions;

maintaining a composition state associated with the remaining domains of the plurality of domains to provide one or more protrusions;

in response to performing the first process, forming a pattern in the block copolymer layer, the pattern including the one or more recessions and the one or more protrusions; and, transferring the pattern in the block copolymer layer into the substrate layer forming an imprint lithography template.

14. The method of claim 13, wherein the first process is an etching process.

15. The method of claim 13, wherein the first process is a chemical reaction.

16. The method of claim 13, wherein the first process is an exposure process.

17. The method of claim 13, further comprising subjecting the block copolymer layer to a second process, the second process affecting at least one domain composition sensitivity.

18. The method of claim 13, wherein the pattern includes a plurality of recessions and a plurality of protrusions.

19. The method of claim 13, wherein transferring the pattern includes applying a planarizing layer to the block copolymer layer and selectively removing portions of the planarizing layer and the block copolymer layer to transfer the pattern into the substrate layer.

\* \* \* \* \*